United States Patent
Shoval et al.

(10) Patent No.: US 11,973,508 B2
(45) Date of Patent: Apr. 30, 2024

(54) PHASE MIXER NON-LINEARITY MEASUREMENT WITHIN CLOCK AND DATA RECOVERY CIRCUITRY

(71) Applicant: Synopsys, Inc., Mountain View, CA (US)

(72) Inventors: Ayal S. Shoval, Toronto (CA); John T. Stonick, Portland, OR (US); Michael W. Lynch, Toronto (CA); Dino Anthony Toffolon, Ontario (CA)

(73) Assignee: Synopsys, Inc., Sunnyvale, CA (US)

( * ) Notice: Subject to any disclaimer, the term of this patent is extended or adjusted under 35 U.S.C. 154(b) by 101 days.

(21) Appl. No.: 17/851,921

(22) Filed: Jun. 28, 2022

(65) Prior Publication Data

US 2023/0421159 A1 Dec. 28, 2023

(51) Int. Cl.
*H03L 7/08* (2006.01)
*H03L 7/081* (2006.01)
*H04L 27/227* (2006.01)

(52) U.S. Cl.
CPC ......... *H03L 7/0807* (2013.01); *H03L 7/0814* (2013.01); *H04L 27/2275* (2013.01)

(58) Field of Classification Search
CPC ..... H03L 7/0807; H03L 7/081; H03L 7/0814; H04L 27/22; H04L 27/227; H04L 27/2275; H04L 27/2278; H04L 27/233
USPC ........ 375/279–283, 324–327, 329–333, 340; 329/304, 306, 307, 345; 455/205, 209
See application file for complete search history.

(56) References Cited

U.S. PATENT DOCUMENTS

| | | | | |
|---|---|---|---|---|
| 10,153,775 | B1 * | 12/2018 | Wurzer | H03L 7/0998 |
| 2002/0060996 | A1 * | 5/2002 | Kwak | H04L 1/0618 |
| | | | | 370/335 |
| 2007/0070968 | A1 * | 3/2007 | Kawasaki | H04L 5/06 |
| | | | | 370/344 |

\* cited by examiner

*Primary Examiner* — Young T. Tse
(74) *Attorney, Agent, or Firm* — Patterson + Sheridan, LLP

(57) ABSTRACT

A system and method that measures the code non-linearity of a phase mixer (PMIX) during active operation of a clock and data recovery (CDR) circuitry. The PMIX circuitry generates a clock signal based on the PMIX codes. The PMIX circuitry receives a plurality of codes and based on the code value, adjusts the phase of the PMIX output clock signal. A number of times each of the plurality of PMIX codes occurs within a respective time period is determined. Non-linearity values are determined based on the number of times. The non-linearity values are stored in a memory.

20 Claims, 11 Drawing Sheets

PHASE MIXER NON-LINEARITY MEASUREMENT WITHIN CLOCK AND DATA RECOVERY CIRCUITRY

TECHNICAL FIELD

The present disclosure relates to phase mixer circuitry of clock and data recovery circuitry, and, more particularly, to determining non-linearity measurement of a phase mixer circuitry during operation.

BACKGROUND

A communication system includes a transmitter circuitry and receiver circuitry. The receiver circuitry is communicatively connected to the transmitter circuitry. The transmitter circuitry and the receiver circuitry each include clock generation circuitry (e.g., phase lock loop (PLL) circuitry, or other clock generation circuitry) that respectively generate a transmitter clock signal and a receiver clock signal. Further, the receiver circuitry receives a data signal transmitted by the transmitter circuitry. As differences may exist between the receiver clock signal and the transmitter clock signal, errors may be present within the data signal received by the receiver circuitry. To mitigate errors within the received data signal, the receiver circuitry includes clock and data recovery (CDR) circuitry that mitigates differences in phase and frequency between the clock signal of the receiver circuitry and the clock signal of the transmitter circuitry.

SUMMARY

In one example, a method includes receiving a plurality of phase mixer (PMIX) codes that adjust a phase of a clock signal at the output of the PMIX circuitry within clock and data recovery circuitry. The method further includes determining a number of times each of the plurality of PMIX codes occur within a respective time period. Further, the method includes determining non-linearity values based on the number of times.

In one example, a system includes a memory and a processor. The memory stores instructions. The processor is coupled with the memory and execute the instructions. The instructions when executed cause the processor to receive a plurality of phase mixer (PMIX) codes that adjust a phase of PMIX circuitry. Further, the processor determines a number of times each PMIX code of the plurality of PMIX codes occurs within a respective time period. The processor further determines non-linearity values based on the number of times.

In one example, a non-transitory computer readable medium includes stored instructions. The stored instructions are executed by a processor to cause the processor to receive a plurality of PMIX codes that adjust a phase of PMIX circuitry. Further, the processor determines, during a first period, a first number of times that a first PMIX code of the plurality of PMIX codes occurs. The processor further determines, during a second period, a second number of times that a second PMIX code of the plurality of PMIX codes occurs. The first period and the second period are non-overlapping. Further, the processor determines non-linearity values for the plurality of PMIX codes based on the first number of times and the second number of times. The processor associates each of the plurality of PMIX codes with a respective non-linearity value, and stores plurality of PMIX codes within a memory.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a system and method for measuring differential non-linearity of phase mixer circuitry during operation.

A communication system includes a transmitter circuitry and receiver circuitry. The receiver circuitry receives a data signal from the communication transmitter circuitry. However, as the receiver circuitry is separate from the transmitter circuitry, the clock signal of the receiver circuitry may differ from the clock signal of the transmitter circuitry. For example, the phase and frequency of the clock signal of the receiver circuitry differs from the phase and frequency of the clock signal of the transmitter circuitry. The differences in the clock signals may result in errors within the received data signal. For example, as the transmitter circuitry transmits the data signal based on the clock signal of the transmitter circuitry, the rising edges of the data are associated with the rising edges of the clock signal of the transmitter circuitry. As the clock signal of the receiver circuitry differs (e.g., has a different phase/frequency) from the clock signal of the transmitter circuitry, errors may be introduced within the received data signal.

In one or more examples, the receiver circuitry includes clock and data recovery (CDR) circuitry to align the edges of the clock signal of the receiver circuitry with the rising edges of the data signal. However, the CDR circuitry may experience jitter due to non-linearity resulting from variations in process, temperature and voltage (e.g., PVT variations) and architecture of the phase-mixer (PMIX) circuitry within the CDR. Accordingly, the CDR circuitry is not able to perfectly phase align the rising edges of the clock signal of the receiver circuitry with the rising edges of the data signal, and phase errors are generated within the received clock signal. In the following, the process for measuring non-linearity of the phase mixer within a CDR circuitry is described. Measurement of said non-linearity is a required first step towards mitigating it and thus improving the performance of the corresponding receiver circuitry. Further, irrespective of any mitigation for said non-linearity, obtaining a measurement of it aids in understanding the effects impairing receiver performance. Technical advantages of the present disclosure include, but are not limited to measuring non-linearities of the PMIX circuitry within the CDR circuitry.

Figure 1:
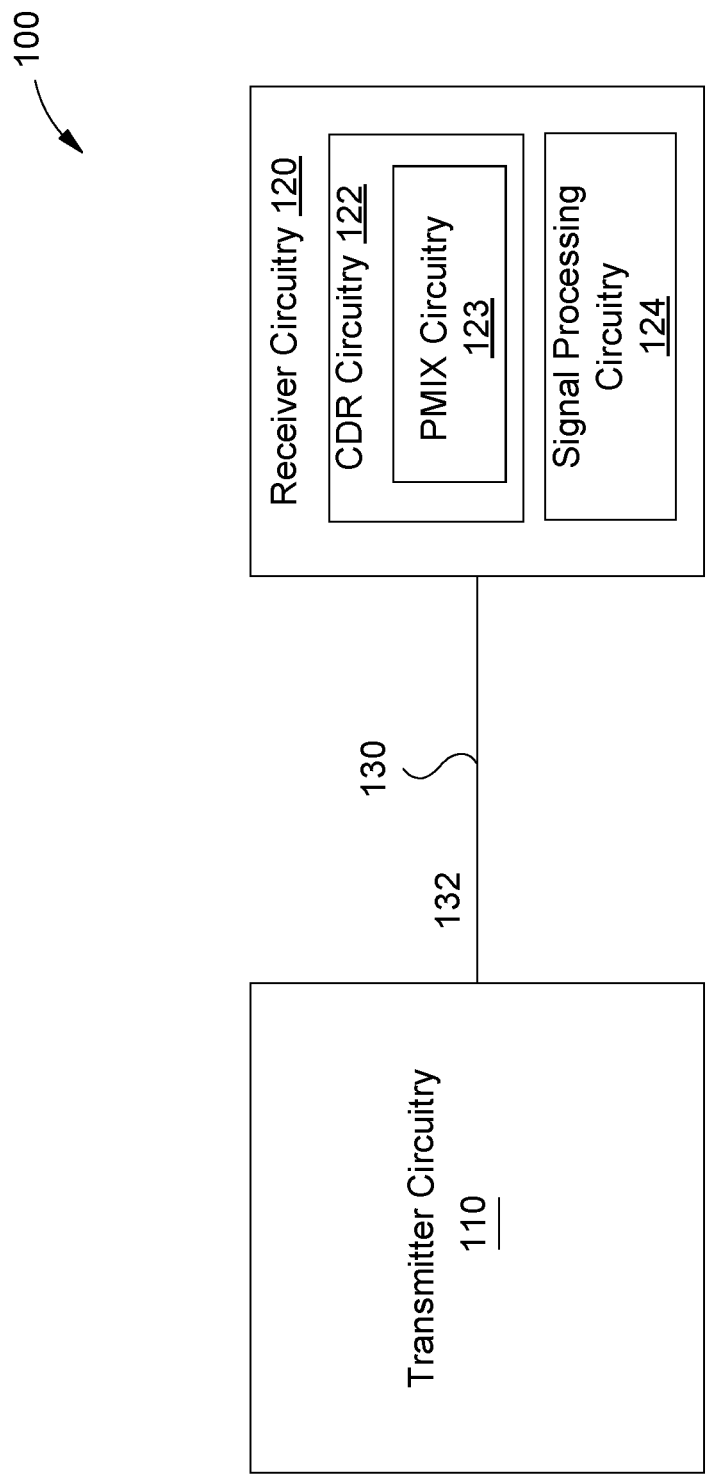
FIG. 1 illustrates a block diagram of a communication system, according to one or more examples.

FIG. 1 illustrates a communication system 100, according to one or more examples. The communication system 100 includes transmitter circuitry 110 and receiver circuitry 120 communicatively connected to each other via channel 130. In one example, the communication system 100 is a serial communication system. Further, in one or more examples, the transmitter circuitry 110 and the receiver circuitry 120 are each part of a serializer-deserializer (SerDes). The communication system 100 is included within one or more integrated circuit (IC) devices. For example, the transmitter circuitry 110 is included within a first IC device and the receiver circuitry 120 is included in a second IC device.

The transmitter circuitry 110 drives (e.g., transmits) a data signal 132 to the receiver circuitry 120 via the channel 130. In one example, the data signal 132 is a serial data signal. The data signal 132 includes one or more symbols. The transmitter circuitry 110 converts each symbol into a voltage which is driven onto the channel 130 and received by the receiver circuitry 120. The transmitter circuitry 110 uses one or more modulation schemes (e.g., a binary non-return-to-zero modulation scheme or a multi-level digital baseband modulation scheme, among others). Further, the transmitter circuitry 110 drives the data signal 132 based on a transmitter clock signal. The transmitter clock signal may be generated locally within the transmitter by clock generation circuitry (e.g., phase-locked loop (PLL) circuitry).

The receiver circuitry 120 receives the data signal 132 from the transmitter circuitry 110 via the channel 130. In one or more examples, the receiver circuitry 120 includes CDR circuitry 122 that generates a clock signal that is based on the transmitter rate of the data signal 132, and accordingly, the clock signal of the transmitter circuitry 110. In one example, the frequency and/or phase of the clock signal is adjusted to be aligned with that of the reference clock signal. In one or more examples, the CDR circuitry 122 adjusts the phase of the clock signal, positioning the clock signal at the mid-position in time of each pulse of the data signal 132 transmitted via the channel 130. In one example, the CDR circuitry 122 is part of equalization circuitry that mitigates inter-symbol interference (ISI) via an equalization process. The equalization process includes restoring the amplitude distortions that occur within the data signal transmitted by the transmitter circuitry 110 via the channel 130.

The receiver circuitry 120 further includes signal processing circuitry 124 that decodes and processes the data signal 132 based on the clock signal generated by the CDR circuitry 122.

In one or more examples, the CDR circuitry 122 includes a phase-locked loop (PLL) circuitry followed by phase mixer (PMIX) circuitry 123. In such an example, the CDR circuitry 122 generates a clock signal with a frequency that is a scalar version of a reference frequency applied to the PLL circuitry. In one or more examples, the frequency of the clock signal may not match that of the data signal 132, as a delta frequency exists between the frequency of the PLL circuitry of the transmitter circuitry 110 and the frequency of PLL circuitry of the receiver circuitry 120. The delta frequency may be measured in parts per million (PPM). The CDR circuitry 122 compensates for the PPM through the use of the PMIX circuitry 123. In one or more examples, the rising edge of the clock signal of the receiver circuitry 120 provided by the PLL circuitry of the receiver circuitry 120 is unaligned with the rising edge of the clock signal of the transmitter circuitry 110. In one or more examples, the PMIX circuitry 123 is used to align the rising edges of the clock signal of the receiver circuitry 120 with the rising edge of the clock signal of the transmitter circuitry 110, mitigating the PPM between the clock signal of the transmitter circuitry and the clock signal of the receiver circuitry.

In one or more examples, the PMIX circuitry of the CDR circuitry 122 synthesizes multiple clock edges of the corresponding PLL clock signal and through the use of a feedback mechanism selects the optimum edges of the clock signals. In one example, for a fixed frequency PPM, if the PMIX circuitry 123 generates M phases over 360 degrees of a scaled version of the PLL clock signal period, the PMIX circuitry 123 is moved from one phase to the next in a period of time to ensure that clock signal of the receiver circuitry 120 is aligned with consecutive rising edges of the clock signal of the transmitter circuitry 110. In one or more examples, the change in phase per unit time of the clock signal of the receiver circuitry 120 represents the effective frequency of the clock signal at the output of the PMIX circuitry 123. Specifically, as illustrated by Equation 1, if a fixed frequency (f) PPM exits between the clock domain of the transmitter circuitry 110 and the receiver circuitry 120, a change in the phase (ϕ) of the clock signal of the receiver circuitry with respect to time (t) is constant.

$$f = \frac{1}{2\pi} \frac{\partial \phi}{\partial t} \qquad \text{Equation 1}$$

Accordingly, to mitigate the PPM between the receiver circuitry clock signal and the transmitter circuitry clock signal, the PMIX circuitry is advanced in phase in equal quantities of phase with time, and the phases of the PMIX circuitry are linearly spaced over 360 degrees.

In one or more examples, performance of the PMIX circuitry 123 is negatively affected by process, and temperature (PVT) variations, as well as mismatches due to circuit fabrication and circuit operating conditions. Accordingly, the PMIX circuitry 123 may not generate linearly spaced clock signal. Further, the clock signal generated by the PMIX circuitry 123 may be negatively affected by amplitude dependent phase variations within the PMIX circuitry 123. For example, the PMIX circuitry 123 generates M phases (where M is one or more) in 360 degrees of a scaled version of the clock signal of the receiver circuitry 120. However, the phases have differential non-linearity (DNL), or non-equal phase steps. The CDR circuitry 122 mitigates for at least a portion of the DNL through the use of feedback. However, not all of the DNL may be removed due to latency and finite loop bandwidth of the CDR circuitry 122. For example, if phase changes occur at a rate that is beyond the bandwidth of the CDR circuitry 122, the changes may not be tracked by the CDR circuitry 122. Accordingly, sampling phase errors may occur (or deterministic jitter) within the receiver circuitry 120, reducing the symbol detection performance of the receiver circuitry 120, introducing errors within the received data signal 132. Further, the sampling phase error is repeated with a periodicity depending on the number of phases in the PMIX circuitry 123, and the frequency PPM difference between the transmitter circuitry 110 and the receiver circuitry 120. The periodicity of the sampling phase error leads to spectral tones in the phase error power spectral density.

The DNL within the PMIX circuitry 123 negatively affects the performance of the receiver circuitry 120. Accordingly, mitigating the DNL improves the performance of the receiver circuitry 120. As is described in greater detail in the following, the DNL of the PMIX circuitry 123 can be measured during operation of the CDR circuitry 122, to provide the requirements for possible mitigation thus improving the performance of the receiver circuitry 120, by minimizing sampling errors within the received data signal 132.

Figure 2:
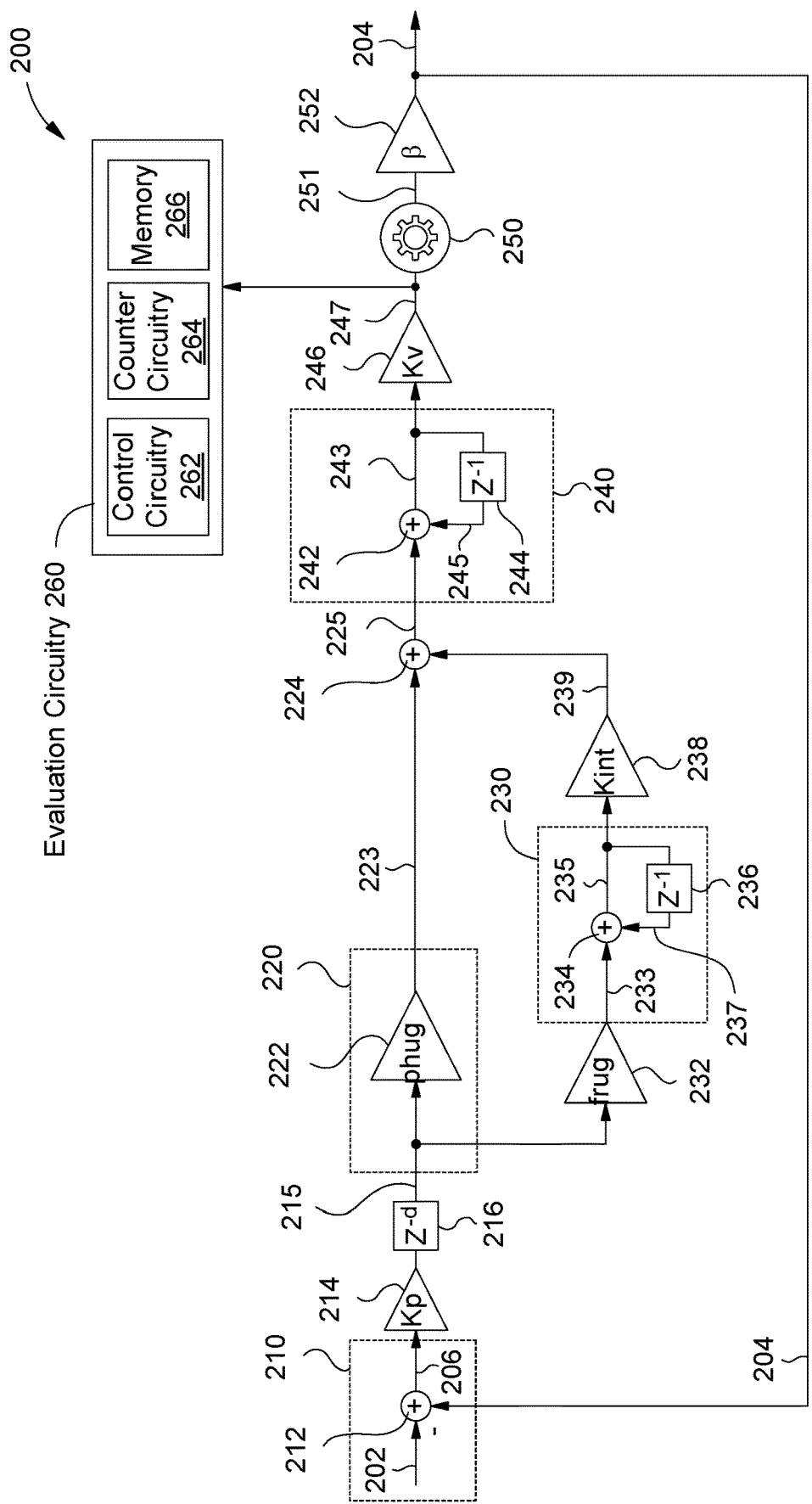
FIG. 2 illustrates a schematic block diagram of clock and data recovery circuitry of a communication system, according to one or more examples.

FIG. 2 illustrates CDR circuitry 200, according to one or more examples. The CDR circuitry 200 includes phase detector 210, phase update gain 220, frequency accumulator 230, phase accumulation circuitry 240, and PMIX circuitry 250. In one or more examples, the CDR circuitry 200 further includes evaluation circuitry 260.

In one or more examples, the CDR circuitry 200 receives the input signal 202. The input signal 202 may be the data signal 132 of FIG. 1. The phase detector 210 receives the input signal 202 and clock signal 204, and generates an error signal 206. The clock signal 204 functions as a feedback signal. The error signal 206 corresponds to a difference in phase between the input signal 202 and the clock signal 204. In one example, the phase detector 210 includes a subtractor 212 that subtracts the clock signal 204 from the input signal 202. The error signal 206 is amplified by the amplifier circuitry 214 and then delayed by delay element 216 to generate delayed error signal 215. The delay of the delay element 216 is d. In one or more examples, the clock signal 204 has an output phase $\phi_{out}$. The output phase $\phi_{out}$ of the clock signal 204 tracks the phase of the input signal 202, and the phase error $\phi_{err}$ of the signal 206. In one example, the phase error $\phi_{err}$ of the signal 206 is reduced to zero.

The delayed error signal 215 is amplified by amplifier 222 of the phase update gain 220 to generate signal 223. Further, the delayed error signal 215 is received by the amplifier (frequency update gain of the CDR circuitry 200) 232, which generates the signal 233. The signal 233 is added to the delayed signal 237 by the summation element 234 of the frequency accumulator 230 to generate the signal 235, which is delayed by delay unit 236 of the frequency accumulator 230 to generate the delayed signal 237. The delay of the delay unit 236 is 1 update cycle. Adding the signal 233 to the delayed signal 237 adds the previous value of the signal 235 to the signal 233 thus implementing an accumulator. Accordingly, the frequency accumulator 230 functions as a counter. The signal 235 is amplified by the amplifier 238 to generate the signal 239. The amplifier 238 represents averaging (Kint) of the frequency accumulator 230. The amplifiers 232 and 238 function as pre-gain and post-gain respectively for the frequency accumulator 230.

The summation element 224 adds the signal 223 with the signal 239 to generate the phase accumulator input update signal 225. In one example, the phase update gain 220 and the frequency accumulator 230 form a loop filter that filters out noise and irrelevant frequency components within the delayed error signal 215.

The phase accumulator input update signal 225 is received by the summation element 242 of the phase accumulation circuitry 240. The summation element 242 combines the phase accumulator input update signal 225 and the delayed signal 245 to generate the signal 243. By adding the phase accumulator input update signal 225 with the delayed signal 245, the phase accumulation circuitry 240 functions as a counter. In one example, the summation element 242 subtracts the delayed signal 245 from the phase accumulator input update signal 225 to generate the signal 243. The signal 243 is delayed by the delay element 244 of the phase accumulation circuitry 240 to generate the delayed signal 245. The delay of the delay element 244 is 1 update cycle. The signal 243 is amplified by the amplifier 246 to generate the signal 247. The amplifier 246 represents averaging Kv of the phase accumulation circuitry 240.

The signal 247 is received by the PMIX circuitry 250. The PMIX circuitry 250 shifts a corresponding phase by X degrees based on the signal 247. X may be in range of about degrees to about 360 degrees. In one example, the phase of the PMIX circuitry 250 is shifted by a phase step or a plurality of phase steps. Each phase step corresponds to a phase shift of one or more degrees. Each phase step may correspond to the same size phase shift. In another example, at least two phase steps correspond to different size phase shifts.

In one example, the PMIX circuitry 250 is controlled by 256 codes. Each of the 256 codes corresponds to a different phase shift. In one or more examples, the PMIX circuitry 250 is controlled by more than or less than 256 codes.

The phase of the PMIX circuitry 250 is shifted based on the signal 247 to generate the signal 251. The signal 251 is received by the amplifier 252. The signal 251 includes a non-linearity of the PMIX circuitry 250.

The signal 251 is amplified by the amplifier 252 to generate the clock signal 204. The amplifier 252 represents the code to phase gain (e.g., parameter β) response of the PMIX circuitry 250. In one example, the signal 251 may be referred to as an impaired signal.

In one or more examples, the clock signal 204 is used by receiver circuitry (e.g., the receiver circuitry 120 of FIG. 1) to shift the phase of a clock signal of the receiver circuitry to be aligned with the phase of a transmitter clock signal (e.g., the clock signal of the transmitter circuitry 110 of FIG. 1) based on the rising edges of a data signal (e.g., the data signal 132 of FIG. 1).

In one or more examples, the CDR circuitry 200 further includes evaluation circuitry 260. The evaluation circuitry 260 receives the signal 247. The signal 247 indicates a PMIX code applied to the PMIX circuitry 250. The evaluation circuitry 260 determines non-linearities of the PMIX circuitry 250 and/or the CDR circuitry 200 based on a count of the number of times each PMIX code occurs within a respective time period. The PMIX codes corresponds to the phase shift applied by the PMIX circuitry 250 when generating the signal 251.

Equations 2 and 3 are discrete transfer functions describing the phase of the clock signal 204 (e.g., output phase $\phi_{out}$) and output phase error $\phi_{err}$ of the CDR circuitry 200 relative to the phase of the input signal ($\phi_{in}$)202.

$$\frac{\phi_{out}}{\phi_{in}} = \quad \text{Equation 2}$$

$$\frac{phug * K_p K_v \beta (1 - z^{-1}) z^{-d} + frug * K_p K_{int} K_v \beta z^{-d}}{(1 - z^{-1})^2 + phug * K_p K_v \beta (1 - z^{-1}) z^{-d} + frug * K_p K_{int} K_v \beta z^{-d}}$$

$$\frac{\phi_{err}}{\phi_{in}} = \quad \text{Equation 3}$$

$$\frac{(1 - z^{-1})^2}{(1 - z^{-1})^2 + phug * K_p K_v \beta (1 - z^{-1}) z^{-d} + frug * K_p K_{int} K_v \beta z^{-d}}$$

The evaluation circuitry 260 includes control circuitry 262, counter circuitry 264, and memory 266. As will be described in greater detail in the following, the evaluation circuitry 260 receives the signal 247, counts the number of times each code occurs within a time period (or a time window), and determines a non-linearity measurement (e.g., DNL) based on a number of times each code occurs within the time period. The evaluation circuitry 260 is a processing device that can be realized in a variety of ways including, but not limited to, a dedicated state machine, a CPU, and software. In one example, the evaluation circuitry 260 counts the number of times each code occurs within a time period, and determines a non-linearity measurement during operation of the CDR circuitry 200. In another example, the evaluation circuitry 260 counts the number of times each code occurs within a time period, and determines a non-linearity measurement during operation of the CDR circuitry 200 when the CDR circuitry 200 and/or corresponding receiver circuitry (e.g., the receiver circuitry 120 of FIG. 1) is in a testing mode or phase. For example, the evaluation circuitry 260 counts the number of times each code occurs within a time period (or window), and determines a non-linearity measurement when the CDR circuitry 200 and/or corresponding receiver circuitry (e.g., the receiver circuitry 120 of FIG. 1) is in an active state.

In one or more examples, the counter circuitry 264 includes one or more counters that count the number of times each code occurs within the period. For example, the counter circuitry 264 determines the number of times each of the 256 codes occurs within a respective period.

Figure 11:
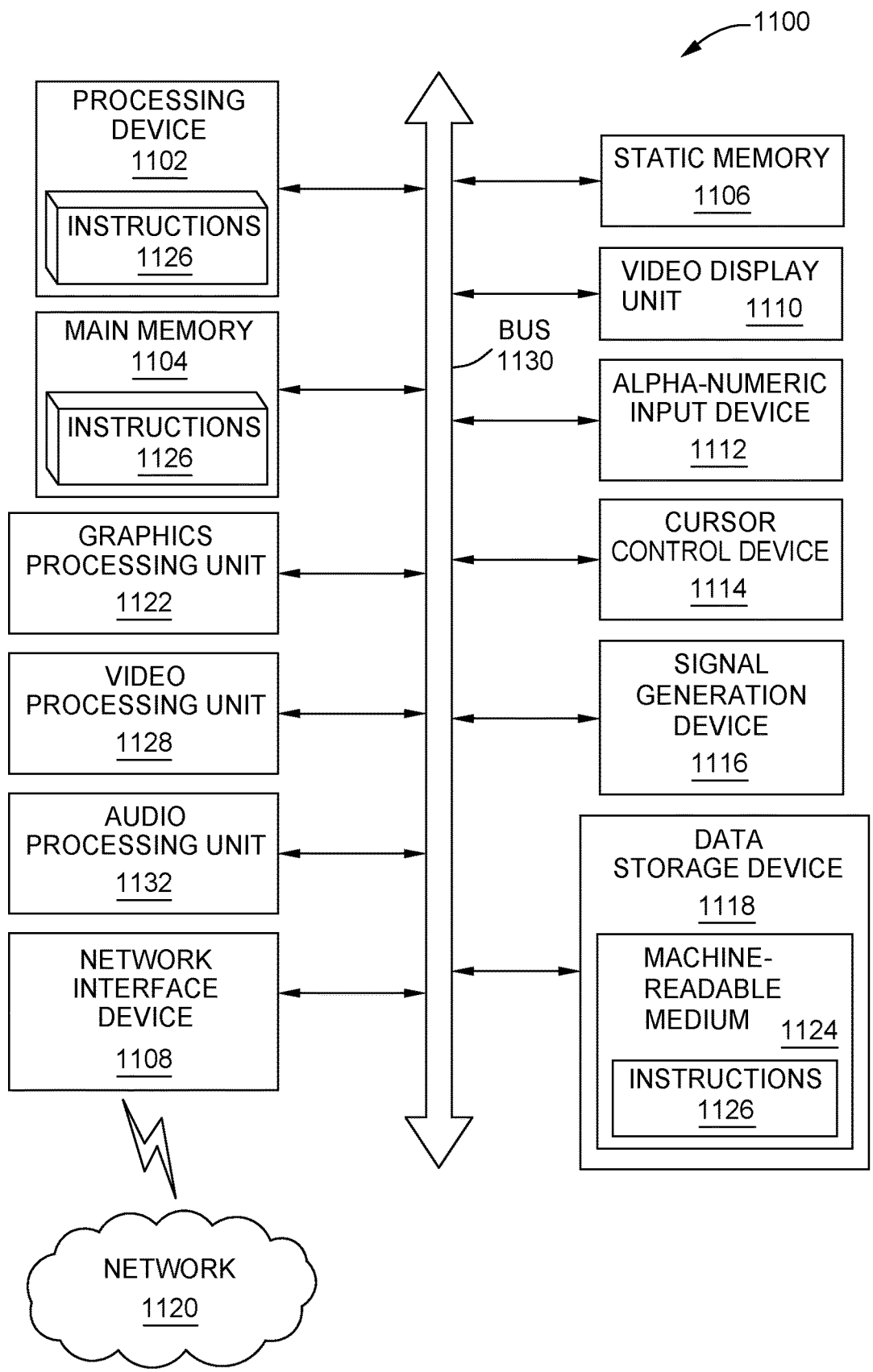
FIG. 11 depicts a diagram of an example computer system in which embodiments of the present disclosure may operate.

In one or more examples, the control circuitry 262 includes one or more processors (e.g., the processing device 1102 of FIG. 11), which executes instructions (e.g., the instructions 1126 of FIG. 11) stored in a memory (e.g., the main memory 1104 of FIG. 11, and/or the machine-readable medium 1124 of FIG. 11). The control circuitry 262 determines a non-linearity measurement from the values within the counter circuitry 264 and saves the non-linearity measurement within the memory 266.

In one or more examples, the CDR circuitry 200 cycles the PMIX circuitry 250 through all of the PMIX codes of the PMIX circuitry 250 to compensate for a frequency PPM deviation between the clock domain of transmitter circuitry (e.g., the transmitter circuitry 110 of FIG. 1) and the clock domain of the corresponding receiver circuitry (e.g., the receiver circuitry 120 of FIG. 1). In one or more examples, when mitigating phase error within the CDR circuitry 200, DNL may be accumulated in time over the PMIX code space of the PMIX circuitry 250. The accumulated DNL is integral non-linearity (INL) over the code space of the PMIX circuitry 250. As the PMIX circuitry 250 cycles through the PMIX codes, the accumulated DNL, or INL, results in phase error within the CDR circuitry 200 and degradation of the performance of the CDR circuitry 200 and the corresponding receiver circuitry. In one or more examples, the INL and DNL of the PMIX circuitry 250 is determined, for example, as described with regard to method 400 of FIG. 4. The determined DNL may be used to mitigate phase error with the PMIX circuitry 250, mitigating errors within the CDR circuitry 200 and the corresponding receiver circuitry. In one or more examples, the INL may be determined from the DNL as described with regard to the method 400 of FIG. 4.

Figure 3:
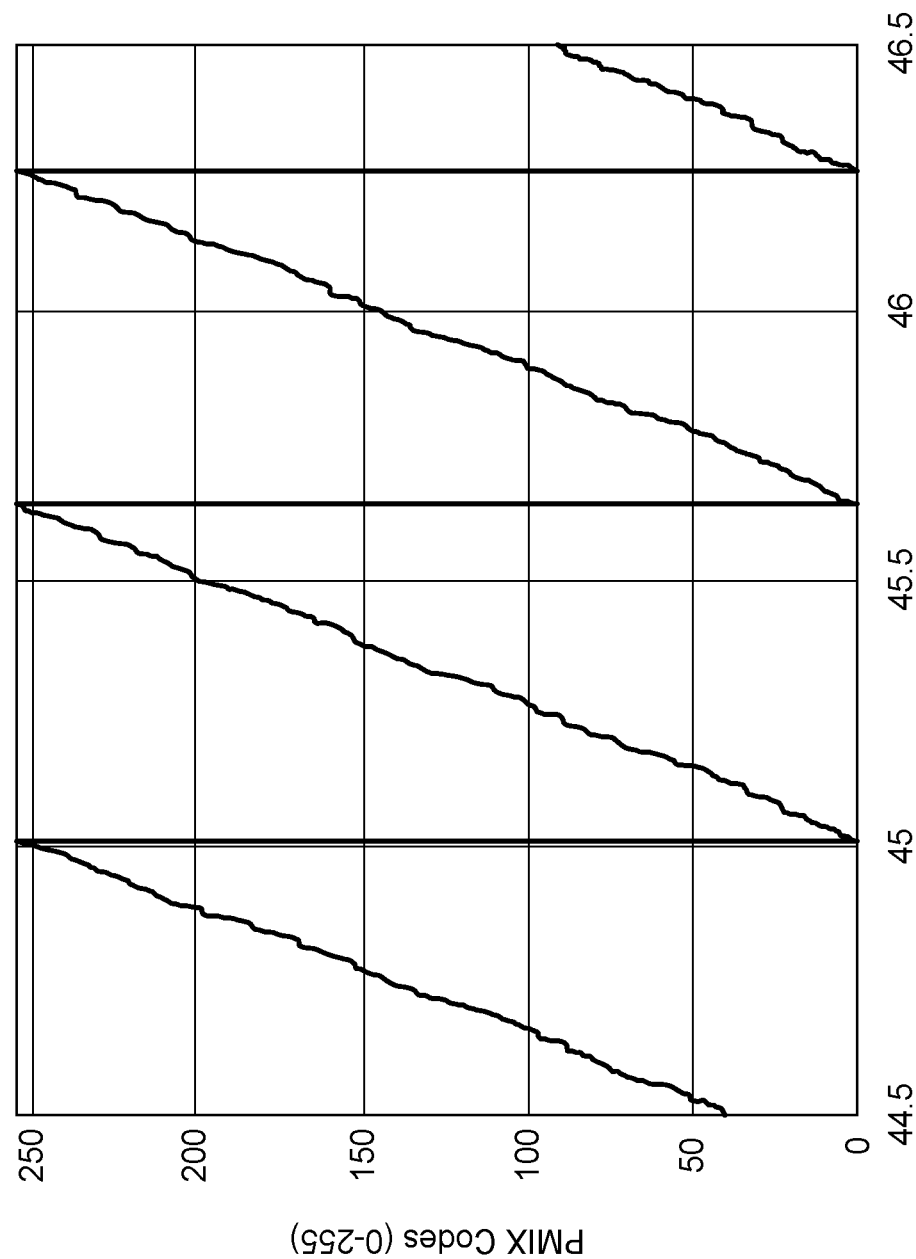
FIG. 3 illustrates a graph of clock and data recovery circuitry output phase plagued by non-linearities of phase mixer circuitry, according to one or more examples.

FIG. 3 illustrates an example of a graph 300 of PMIX code variation over time of a fixed frequency PPM between a transmitter clock signal and receiver circuitry clock signal. Each of the ramps corresponds to a difference cycle of the PMIX codes. In a scenario where the only timing error between the transmitter clock signal and receiver clock signal is due to a frequency offset, each ramp in the graph 300 will have consistent excursions from a straight line (e.g., correlating in vertical position for each ramp signal) due to INL within the PMIX circuitry (e.g., PMIX circuitry 250 of FIG. 2). The DNL of the PMIX circuitry and corresponding CDR circuitry is determined by determining a difference between the graph 300 and a best line fit, and differentiating the difference. Further, low frequency jitter and noise may negatively affect the performance of the CDR circuitry (e.g., the CDR circuitry 200 of FIG. 2). The low frequency jitter and noise causes the waveform of the graph 300 to have jitter and other inconsistences. In one or more examples, to determine the DNL, a histogram of the PMIX codes is determined as described with regard to method 400 of FIG. 4.

Figure 4:
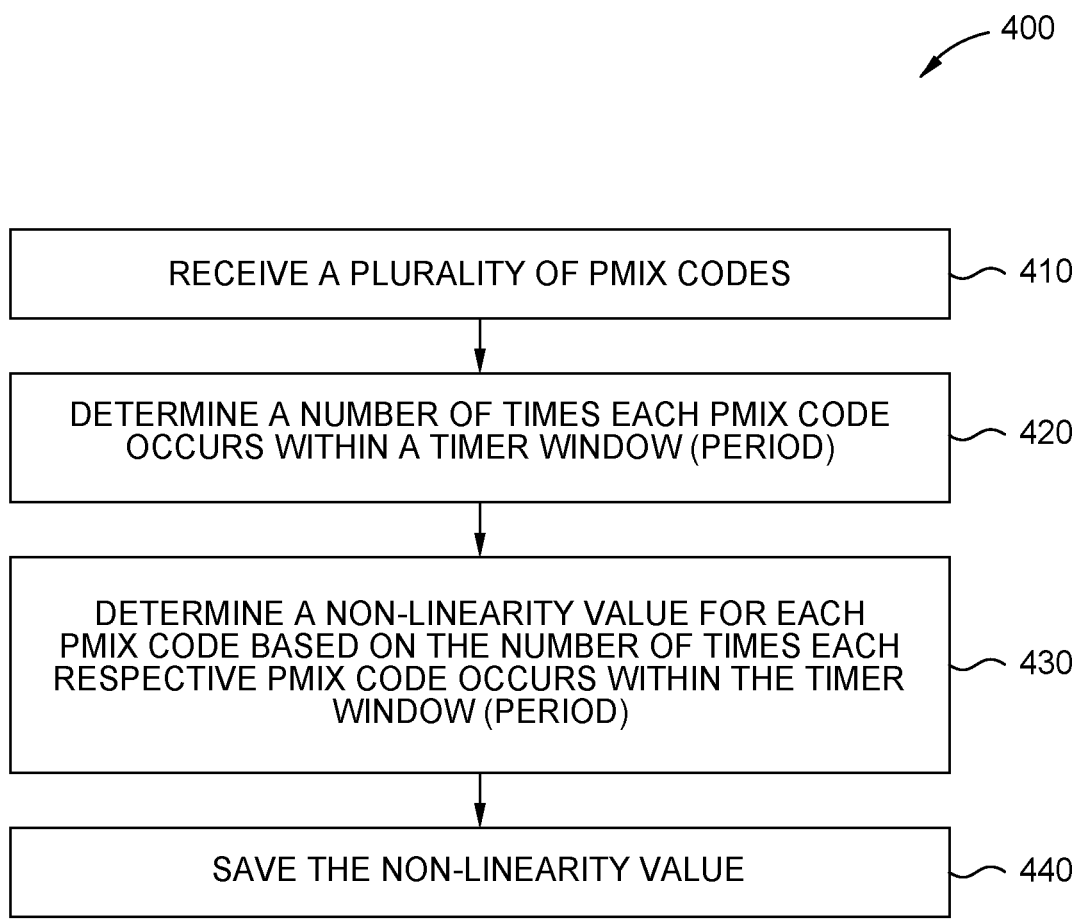
FIG. 4 depicts a flowchart of a method for determining non-linearity values for a clock and data recovery circuitry.

FIG. 4 illustrates a flowchart of the method 400, according to one or more examples. In one or more examples, the method 400 is performed by the evaluation circuitry 260. The evaluation circuitry 260 performs the method 400 to determine the DNL of the PMIX circuitry 250. The method 400 may be performed at initialization (e.g., startup) and/or during operation of the corresponding receiver circuitry (e.g., receiver circuitry 120 of FIG. 1) and CDR circuitry (e.g., the CDR circuitry 200 of FIG. 2). In the following, the method 400 is described with regard to FIG. 2.

At 410 of the method 400, a plurality of PMIX codes is received by the evaluation circuitry 260. In one example, the signal 247 is received by the evaluation circuitry 260. The signal 247 includes a PMIX code, indicating a phase offset applied by the PMIX circuitry 250.

At 420 of the method 400, a number of times each PMIX code occurs within a respective timer window (period) is determined by the evaluation circuitry 260. During a first timer period (e.g., first time window), the evaluation circuitry 260 determines the number of times the PMIX code 0 occurs during a first timer period, during a second timer period the number of times the PMIX code 1 occurs, and during an Nth timer period the number of times the PMIX code N occurs. N is 0 or more. In one example, N is 255. In other examples, N is greater than or less than 255. The number of timer periods (windows) is equal to the number of PMIX codes. Further, the length of the timer period is W, where W is greater than 0 and is measured in cycles of the CDR/PMIX update cycle rate. In other examples, the length of the timer period is multiples of clock periods of the clock signal of the respective receiver circuitry. In one or more examples, the counter circuitry 264 increments a counter each time a selected PMIX code is determined to be in the signal 247. For example, during a first period, a counter is incremented each time the PMIX code 0 is determined to be in the signal 247. At the end of the timer period, the control circuitry 262 stores the value of the counter (e.g., the counter value) of the counter circuitry 264 within the memory 266 at location 0 and resets the counter. In other examples, the control circuitry 262 stores the value of the counter in the counter circuitry 264 into the memory 266 at the end of the timer period and does not reset the counter.

Figure 5:
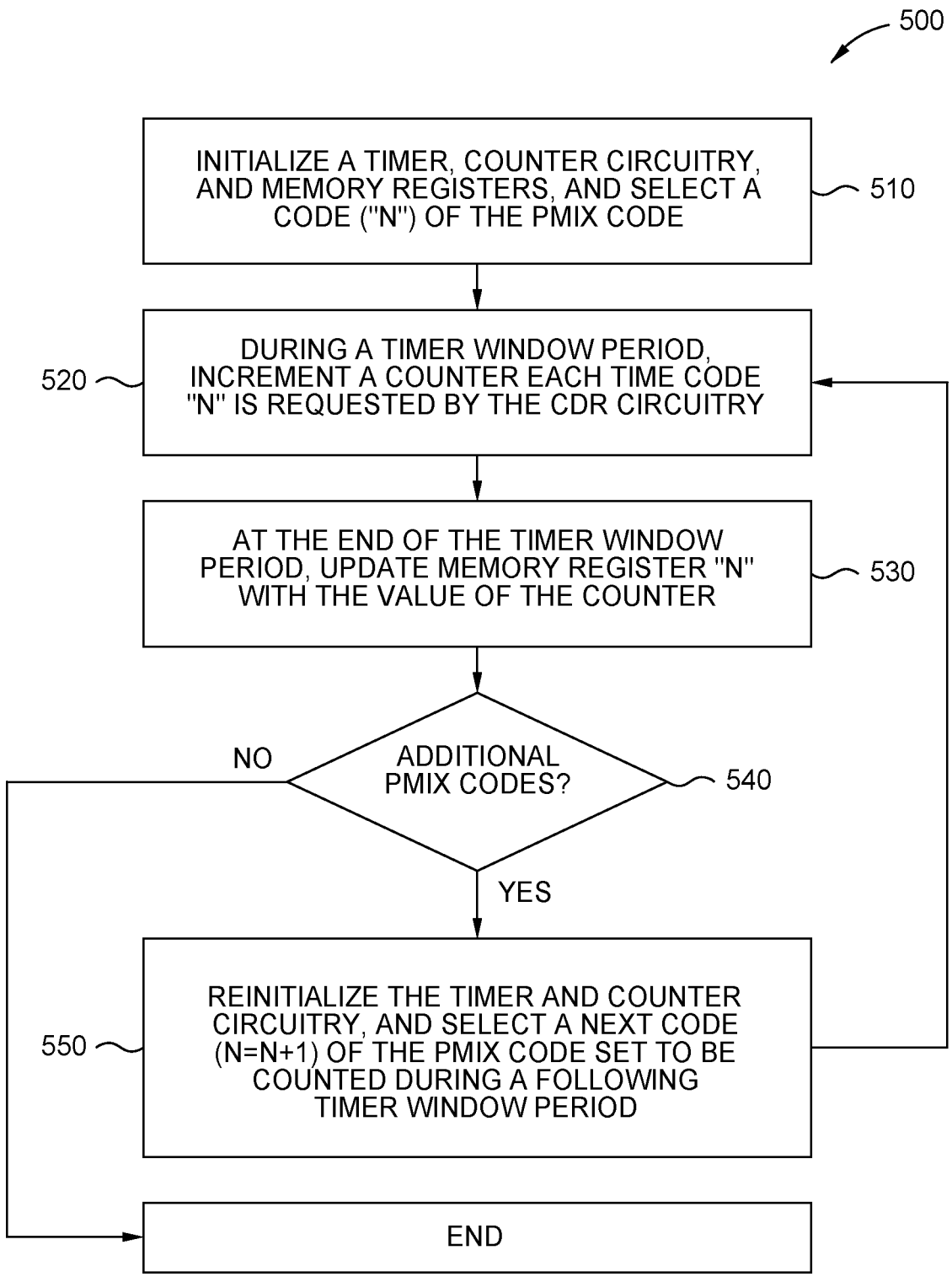
FIG. 5 illustrates a flowchart of a method of counting the occurrence of phase mixer codes, according to one or more examples.

In one or more examples, determining the number of times each code occurs within a timer period includes method 500 of FIG. 5. At 510 of the method 500, a timer, the counter circuitry 264 (e.g., one or more counters of the counter circuitry 264), and the memory 266 (e.g., one or more registers of the memory 266) are initialized by the control circuitry 262. For example, the control circuitry 262 initializes a timer of the control circuitry 262 with a value of W cycles of an update clock signal of the PMIX circuitry 250, where W is one or more. Further, the control circuitry 262 initiates a counter of the counter circuitry 264 to an initialization value M, where M is zero or more. The control circuitry 262 further initiates N registers within the memory 266, where N is equal to the number of codes of the PMIX codes. In one example, N is 256. In another example, N is greater than or less than 256.

At 520 of the method 500, the control circuitry 262 increments the counter of the counter circuitry 264 each time a code "N" of the PMIX codes is requested by the CDR circuitry (e.g., occurs within the signal 247 during a CDR update cycle).

At 530 of the method 500, the control circuitry 262 updates the memory 266 at an "Nth" register within the memory with the value of the counter at the completion of the W cycles of the CDR update clock (e.g., the timer window), the control circuitry 262 updates a respective register of the memory 266.

At 540 of the method 500, the control circuitry 262 determines if there are additional PMIX codes to count. For example, the control circuitry 262 compares the value of N to the total number of PMIX codes, and based on the value of N being less than the total number of PMIX codes, a determination is made that there are additional PMIX codes to be counted and the method proceeds to 550.

At 550 of the method 500, and the control circuitry 262 reinitializes the timer and the value of the counter of the counter circuitry 264, and selects the next code ("N=N+1") of the PMIX codes to be counted during a following timer period ("N"th timer window) period ("N=N+1"). The method 500 then proceeds to 520 of the method 500. The loop of 520, 530, 540, and 550 of the method 500 is repeated until each of the PMIX codes is analyzed, and then the method 500 ends. In one or more examples, the method 500 may be repeated, and the values within the memory 266 are updated to track changes in the performance of the CDR circuitry 200 and the PMIX circuitry 250 of FIG. 2. For example, the method 500 may be performed during start-up of the corresponding receiver circuitry, and/or during operation of the corresponding receiver circuitry.

With further reference to FIG. 4, at 430 of the method 400, a non-linearity value for each PMIX code is determined based on the number of times each respective PMIX code occurs within the timer window (period) by the evaluation circuitry 260. The non-linearity value may be a DNL value (s) and/or INL value (s). In one example, the control circuitry 262 obtains the count values stored in the registers of the memory 266 and determines one or more linearity values based on the count values.

Figure 6:
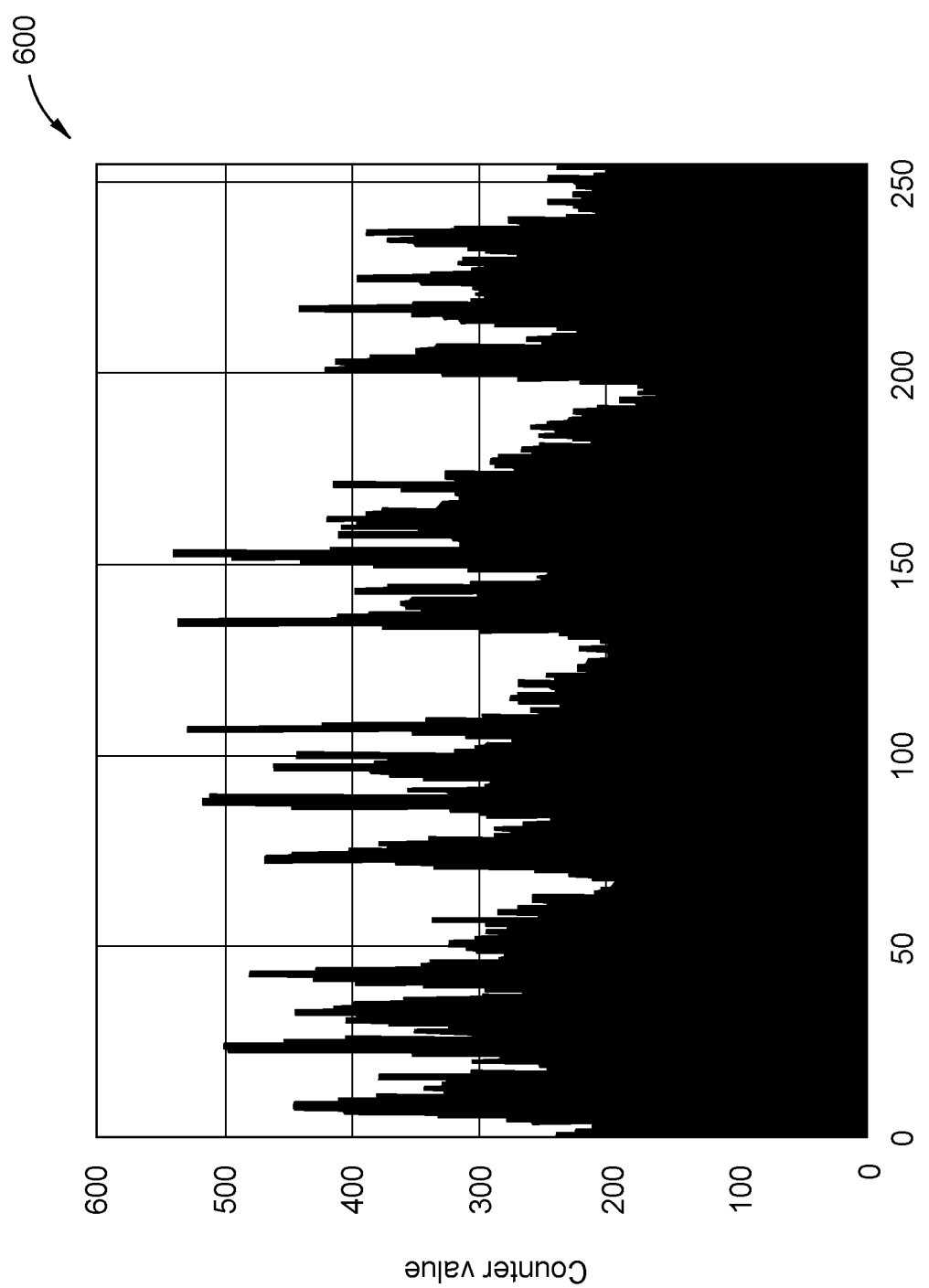
FIG. 6 illustrates a histogram formed from the number of occurrences of phase mixer codes, according to one or more examples.

In one example, determining the non-linearity value or values includes determining the histogram 600 of FIG. 6. The histogram 600 includes a plurality of bins, where each bin corresponds to a respective code of the plurality PMIX codes. In one example, the value of each bin is the count value of the occurrence of a corresponding PMIX code in a given observation window of time. In an example where the PMIX codes includes codes 0-255, the histogram includes 256 bins, and the value for each bin is the count value associated with a respective one of the 256 codes.

In an example where the performance of CDR circuitry 200 and the PMIX circuitry 250 of the FIG. 2 is linear, the values of the histogram 600 are uniformly distributed over the bins. As the values within the histogram 600 vary from bin to bin of the histogram 600, the histogram 600 indicates that the corresponding CDR circuitry 200 and the PMIX circuitry 250 is negatively affected by non-linearities. For example, the performance of the CDR circuitry 200 and the PMIX circuitry 250 includes DNL corresponding to the differences in values between the bins of the histogram 600. In one or more examples, to determine the non-linearity values for the PMIX codes, the control circuitry 262 determines the cumulative sum of the histogram 600, and proportionally scales the cumulative sum by the maximum PMIX code (e.g., a PMIX code of 255, or another PMIX code value). Further, the scaled cumulative sum is inversely scaled by the maximum value of the cumulative sum, generating the graph 700 of FIG. 7.

Figure 7:
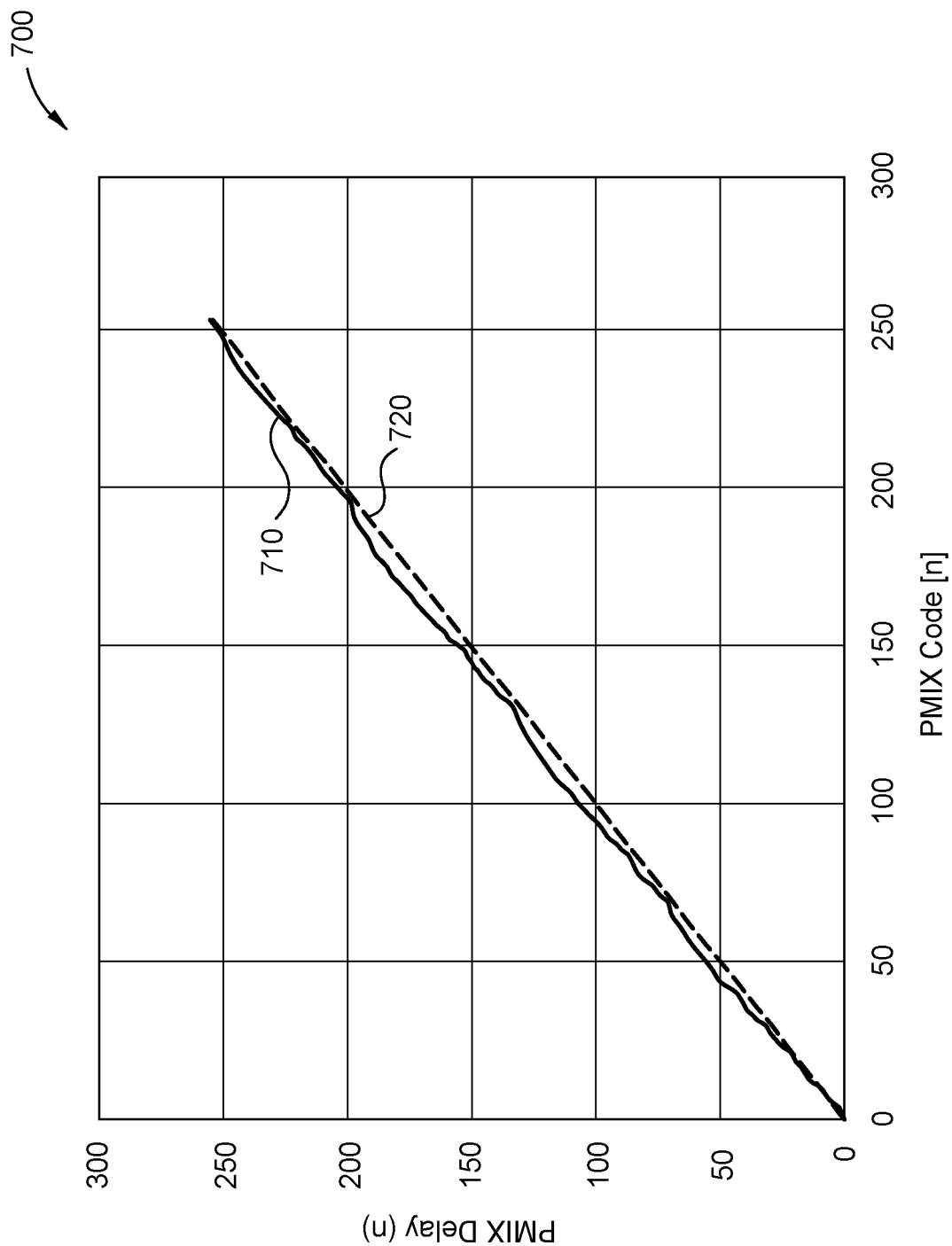
FIG. 7 illustrates a graph of the cumulative sum of occurrences of phase mixer codes of normalized to the maximum value of the phase mixer codes of clock and data recovery circuitry, according to one or more examples.
Figure 8:
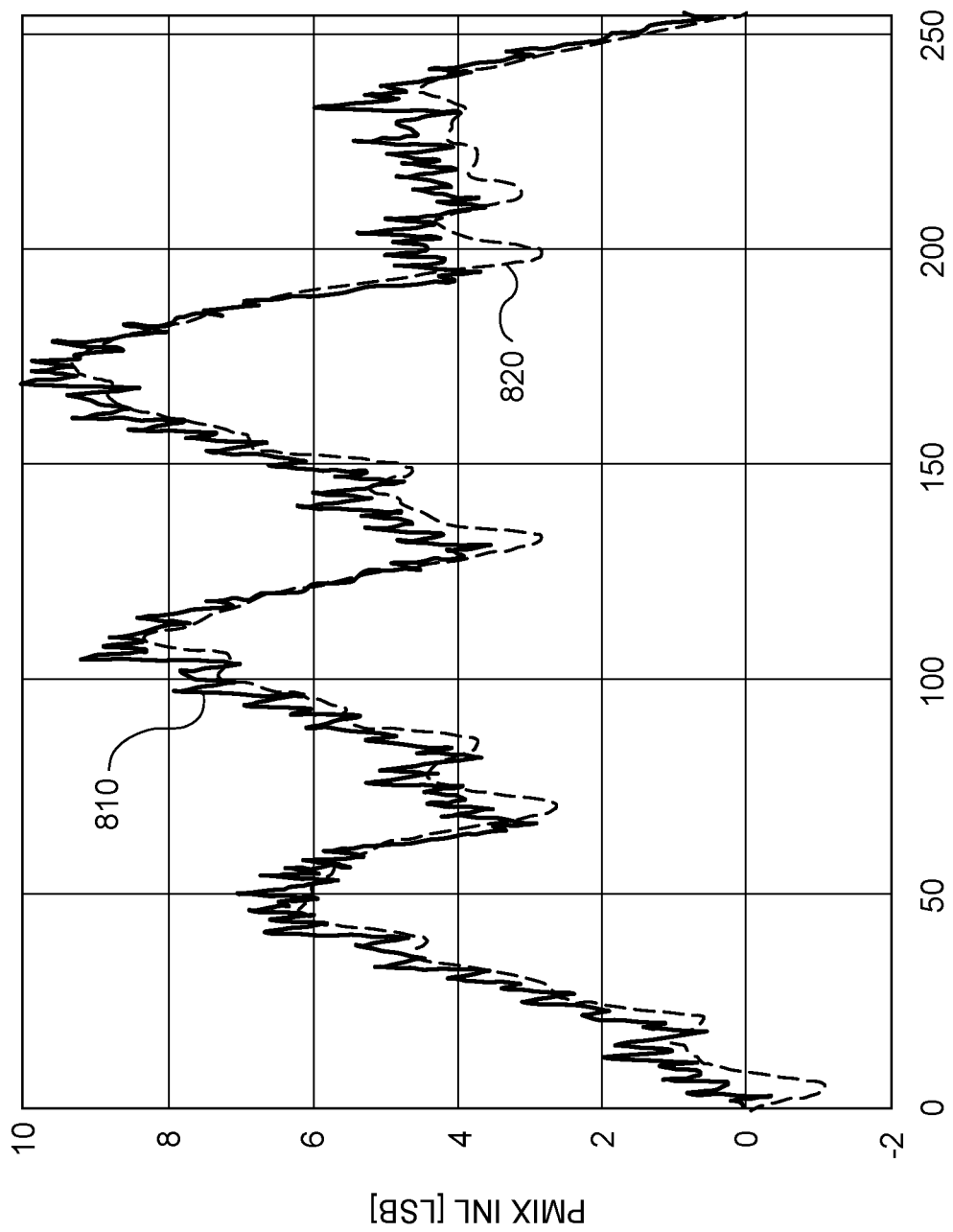
FIG. 8 illustrates a graph of integral non-linearity values for each phase mixer codes of clock and data recovery circuitry, according to one or more examples.

The graph 700 of FIG. 7 includes line 710 and line 720. The line 710 corresponds to the INL within the CDR circuitry 200 and the PMIX circuitry 250 over the PMIX codes, e.g., PMIX codes 0-255. In one or more examples, the line 720 is a best fit line over the PMIX codes. The control circuitry 262 determines a difference between the line 710 and the line 720 to determine the INL of the PMIX circuitry 250. The graph 800 of FIG. 8 illustrates the INL in line 810 determined from the graph 700 of FIG. 7. The line 820 corresponds to a measured and actual INL of the CDR circuitry 200 and PMIX circuitry 250 of FIG. 2. Accordingly, as the line 810 corresponds to the line 820, the INL determined from the histogram 600 corresponds to the measured INL in line 820.

Figure 9:
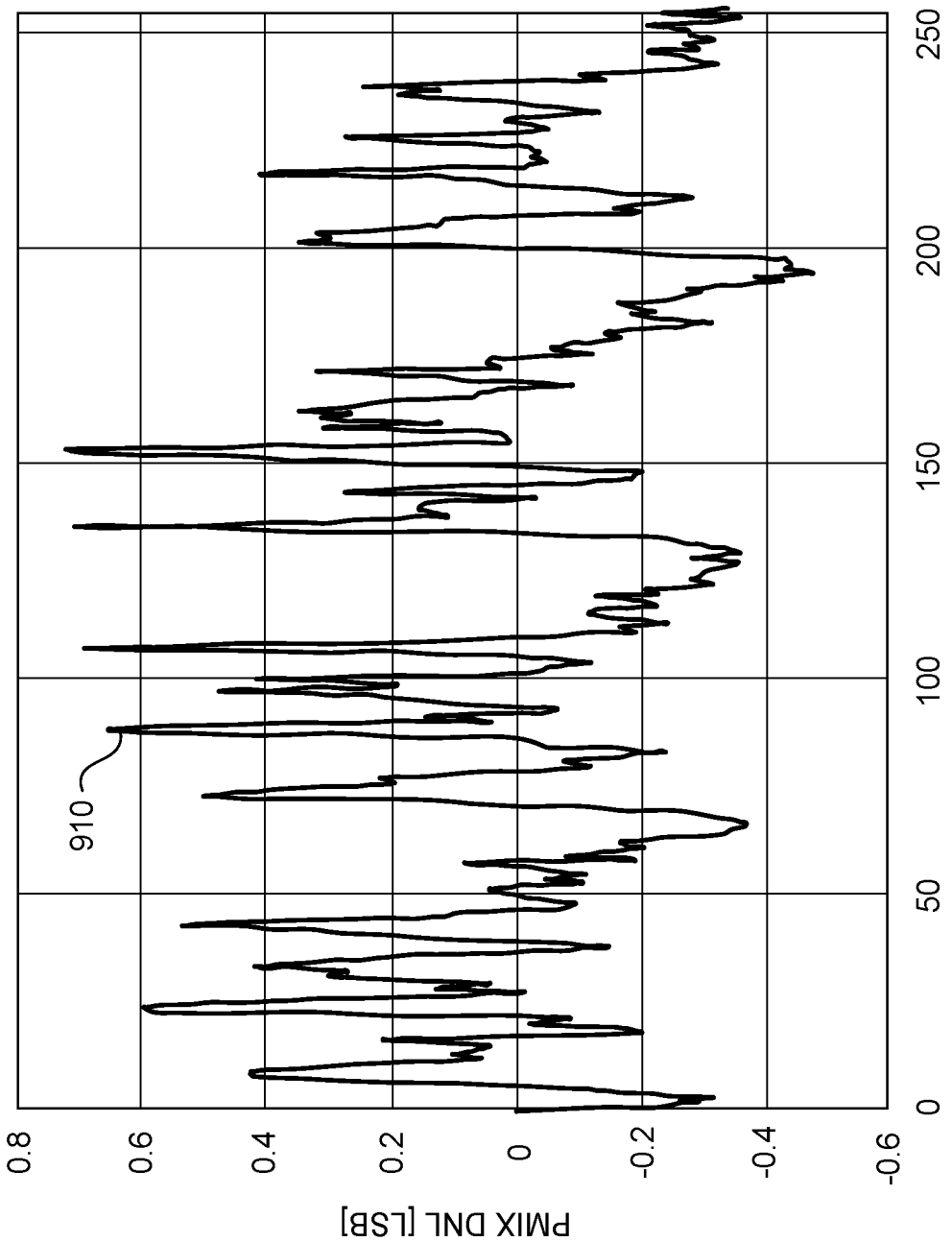
FIG. 9 illustrates a graph of differential non-linearity values of clock and data recovery circuitry, according to one or more examples.

In one or more examples, the INL as illustrated in line 810 of the graph 800 is differentiated with respect to the PMIX code by the control circuitry 262 to determine the DNL of the CDR circuitry 200 and the PMIX circuitry 250. The DNL is saved within the memory 266 as a non-linearity value or values. The line 910 of the graph 900 of FIG. 9 illustrates the DNL determined from the INL of line 710 of the graph 700.

With further reference to FIG. 4, at 440 of the method 400, the non-linearity value is stored in a memory. For example, the control circuitry 262 saves the non-linearity value, or non-linearity values, in the memory 266. In one example, the non-linearity values are stored within a look-up-table (LUT) within the memory 266. The LUT associates a linearity value with each respective PMIX code. For example, each of the PMIX codes includes an entry within the LUT with a respective non-linearity value.

Figure 10:
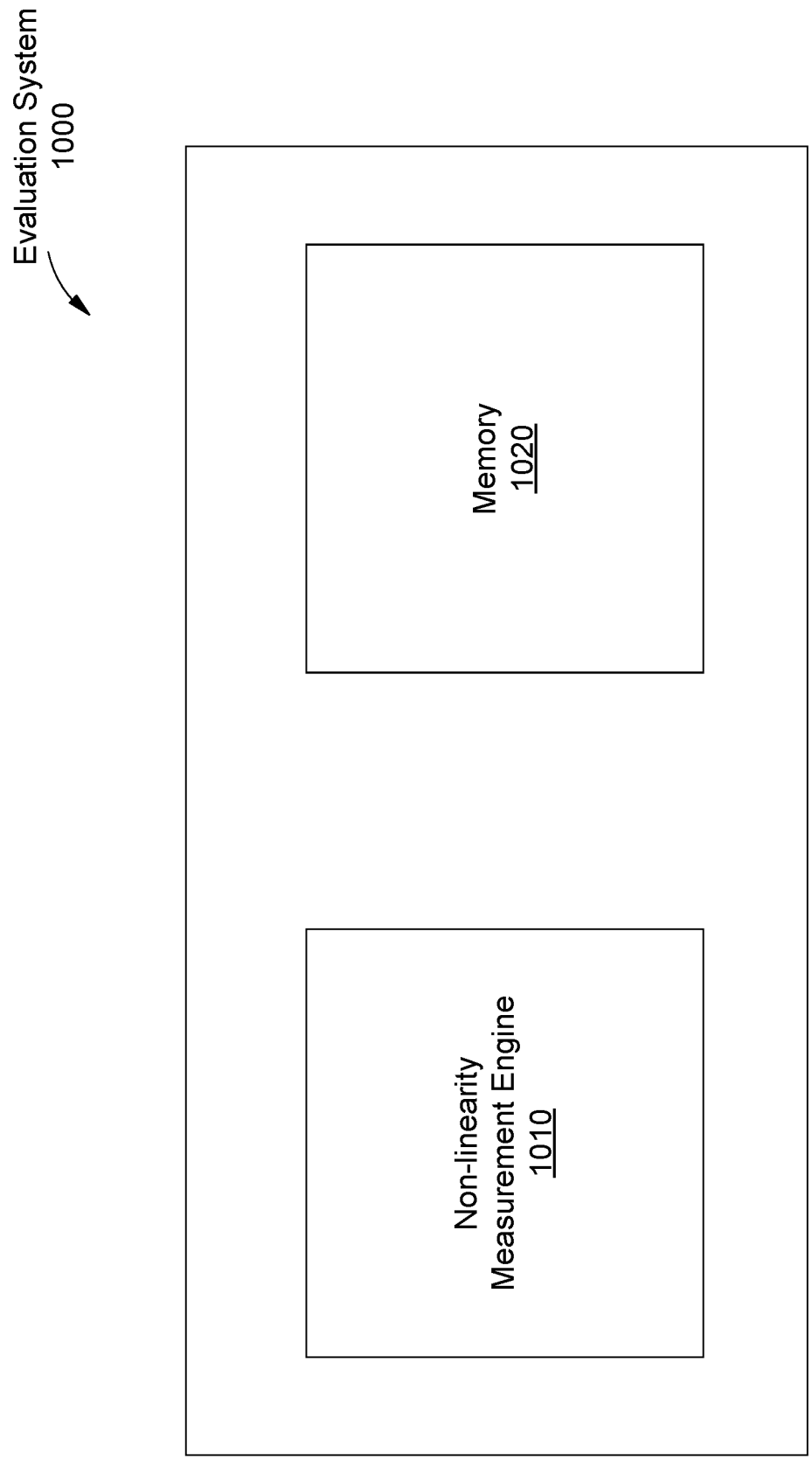
FIG. 10 illustrates a block diagram of an example evaluation system, according to one or more examples.

In another example, the method 400 is performed by the evaluation system 1000 of FIG. 10. The evaluation system 1000 includes one or more processors (e.g., the processing device 1102 of FIG. 11), which executes instructions (e.g., the instructions 1126 of FIG. 11) stored in a memory (e.g., the main memory 1104 of FIG. 11, and/or the machine-readable medium 1124 of FIG. 11). In one or more examples, the evaluation system 1000 includes a non-linearity measurement engine 1010 and memory 1020. The non-linearity measurement engine 1010 includes one or more processors (e.g., the processing device 1102 of FIG. 11), which executes instructions (e.g., the instructions 1126 of FIG. 11) stored in a memory (e.g., the main memory 1104 of FIG. 11, and/or the machine-readable medium 1124 of FIG. 11). The non-linearity measurement engine 1010 determines a measurement of the differential non-linearity (DNL) of the PMIX circuitry (e.g., PMIX circuitry 250 of FIG. 2) based on the control codes by performing the method 500 of FIG. 5.

In one or more examples, for a static frequency PPM of a CDR circuitry (e.g., the CDR circuitry 200 of FIG. 2), the INL (or DNL) shape over PMIX codes repeat with a periodicity determined by Equation 4.

$$F_{pmix\_inl} = PPM * F_{baud} \frac{\text{pmix\_phases\_per\_ui}}{\text{pmix\_phases\_total}} \quad \text{Equation 4}$$

In Equation 4, $F_{pmix\_inl}$ represents the frequency of repetition of the INL (i.e., the ramp repetition frequency), $F_{baud}$ represents the transmission baud rate, pmix_phases_per_ui represents the number of PMIX phases per baud period, and pmix_phases_total represents the total number of PMIX phases. In one or more examples, if a PMIX circuitry (e.g., the PMIX circuitry 250 of FIG. 2) has 64 phases per baud period, a total of 256 phases (per 360 degrees) a baud rate of 53.125 Gbaud, and a PPM of 200, the INL profile (for codes 0-255) repeats at a rate of 2.65625 MHz. In one example, the Fast Fourier Transform (FFT) of the INL (DNL accumulation due to latency of the CDR circuitry 200) represents the power spectral density of the residual phase error of the CDR circuitry.

In one or more examples, the lower the frequency PPM, the lower the frequency content of the DNL. In such examples, the CDR circuitry (e.g., the CDR circuitry 200 of FIG. 2) can track the DNL with increased accuracy. However, in examples with lower frequency PPM, the DNL measurement is more susceptible to noise and/or jitter. Averaging may be used to reduce effects of the noise and/or jitter. In one or more examples, the method 500 of FIG. 5 may be used to reduce the effects of the noise and/or jitter. In one example, to reduce the noise and/or jitter, a number of occurrences per bin of the histogram (e.g., dwell time) is one or more, to reduce the effects of the noise and/or jitter. In one example, repeating the method 500 multiple times (e.g., two or more times), reduces noise and/or jitter within the DNL of the CDR circuitry 200 of the PMIX circuitry 250.

In one example, for a PMIX circuitry (e.g., the PMIX circuitry 250 of FIG. 2) having an update rate of $F_{pmx}$ that has codes_ui phases per baud rate, the frequency PPM that the PMIX circuitry achieves relative to the frequency of the corresponding receiver circuitry is determined by Equation 5.

$$PPM = \frac{1}{\text{code\_ui}} \frac{F_{pmx}}{F_{baud}} \text{steps} * 10^6 \quad \text{Equation 5}$$

In one example, the PMIX circuitry 250 has 64 phase per UI and a baud rate of 32 e9 and a PMIX update rate of 2 GHz. Accordingly, the frequency PPM per PMIX code is 976 ppm. In one example, the frequency PPM between the transmitter circuitry (e.g., the transmitter circuitry 110 of FIG. 1) and the receiver circuitry (e.g., the receiver circuitry 120 of FIG. 1) is 200 ppm, having a dwell time of 4 or 5.

In one or more examples, reducing the PPM between the transmitter circuitry (e.g., the transmitter circuitry 110) and the receiver circuitry (e.g., the receiver circuitry 120) allows for the DNL of the CDR circuitry (e.g., the CDR circuitry 200 of FIG. 2) and the PMIX circuitry (e.g., the PMIX circuitry 250 of FIG. 2) to be determined via the method 500 of FIG. 5.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure and histogram generation have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving a plurality of phase mixer (PMIX) codes, wherein the plurality of PMIX codes adjust a phase of PMIX circuitry;
   determining, by a processing device, a number of times each of the plurality of PMIX codes occurs within a respective time period; and
   determining, by the processing device, non-linearity values based on the number of times.

2. The method of claim 1, wherein determining the number of times comprises:
   determining, during a first period, a first number of times that a first PMIX code of the plurality of PMIX codes occurs; and
   determining, during a second period, a second number of times that a second PMIX code of the plurality of PMIX codes occurs, the first period and the second period are non-overlapping.

3. The method of claim 2, wherein determining the non-linearity values comprises comparing the first number of times with the second number of times.

4. The method of claim 1 further comprising:
   determining a histogram based on the number of times, the histogram comprising a plurality of bins, each of the plurality of bins corresponds to a respective one of the plurality of PMIX codes.

5. The method of claim 4, wherein determining the non-linearity values comprises determining an integral non-linearity (INL) for the plurality of PMIX codes based on the histogram.

6. The method of claim 5, wherein determining the INL for the plurality of PMIX codes comprises:
   determining a cumulative sum of the histogram;
   scaling the cumulative sum by a maximum PMIX code of the plurality of PMIX codes to generate a scaled cumulative sum; and
   inversely scaling the scaled cumulative sum by a value of the cumulative sum.

7. The method of claim 5 further comprising differentiating the INL with respect to each of the plurality of PMIX codes to determine differential non-linearity (DNL) for the plurality of PMIX codes.

8. The method of claim 1 further comprising saving the non-linearity values within a look-up-table and associating each of the plurality of PMIX codes with a respective one of the non-linearity values.

9. A system comprising:
a memory storing instructions; and
a processor, coupled with the memory and configured to execute the instructions, the instructions when executed cause the processor to:
receive a plurality of phase mixer (PMIX) codes, wherein the plurality of PMIX codes adjust a phase of PMIX circuitry;
determine a number of times each PMIX code of the plurality of PMIX codes occurs within a respective time period; and
determine non-linearity values based on the number of times.

10. The system of claim 9, wherein
determining the number of times comprises:
determining, during a first period, a first number of times that a first PMIX code of the plurality of PMIX codes occurs; and
determining, during a second period, a second number of times that a second PMIX code of the plurality of PMIX codes occurs, the first period and the second period are non-overlapping.

11. The system of claim 10, wherein determining the non-linearity values comprises comparing the first number of times with the second number of times.

12. The system of claim 9, wherein the processor is further caused to:
determine a histogram based on the number of times, the histogram comprising a plurality of bins, each of the plurality of bins corresponds to a respective one of the plurality of PMIX codes.

13. The system of claim 12, wherein determining the non-linearity values comprises determining an integral non-linearity (INL) for the plurality of PMIX codes based on the histogram.

14. The system of claim 13, wherein determining the INL for the plurality of PMIX codes comprises:
determining a cumulative sum of the histogram;
scaling the cumulative sum by a maximum PMIX code of the plurality of PMIX codes to generate a scaled cumulative sum; and
inversely scaling the scaled cumulative sum by a value of the cumulative sum.

15. The system of claim 13, wherein the processor is further caused to:
differentiate the INL with respect to each of the plurality of PMIX codes to determine differential non-linearity (DNL) for the plurality of PMIX codes.

16. The system of claim 9, wherein the processor is further caused to:
save the non-linearity values within a look-up-table and associate each of the plurality of PMIX codes with a respective one of the non-linearity values.

17. A non-transitory computer readable medium comprising stored instructions, which when executed by a processor, cause the processor to:
receive a plurality of phase mixer (PMIX) codes, wherein the plurality of PMIX codes adjust a phase of PMIX circuitry;
determine, during a first period, a first number of times that a first PMIX code of the plurality of PMIX codes occurs;
determine, during a second period, a second number of times that a second PMIX code of the plurality of PMIX codes occurs, the first period and the second period are non-overlapping;
determine non-linearity values for the plurality of PMIX codes based on the first number of times and the second number of times; and
associate each of the plurality of PMIX codes with a respective non-linearity value, and store the plurality of PMIX codes.

18. The non-transitory computer readable medium of claim 17, wherein the processor is further caused to:
determine a histogram based on the first number of times and the second number of times, the histogram comprising a plurality of bins, each of the plurality of bins corresponds to a respective one of the plurality of PMIX codes.

19. The non-transitory computer readable medium of claim 18, wherein determining the non-linearity values comprises:
determining an integral non-linearity (INL) for the plurality of PMIX codes based on the histogram; and
differentiating the INL with respect to each of the plurality of PMIX codes to determine differential non-linearity (DNL) for the plurality of PMIX codes.

20. The non-transitory computer readable medium of claim 19, wherein determining the INL for the plurality of PMIX codes comprises:
determining a cumulative sum of the histogram;
scaling the cumulative sum by a maximum PMIX code of the plurality of PMIX codes to generate a scaled cumulative sum; and
inversely scaling the scaled cumulative sum by a value of the cumulative sum.

* * * * *